United States Patent [19]

Soref

[11] Patent Number: 4,671,605
[45] Date of Patent: Jun. 9, 1987

[54] LENGTH DEPENDENT, OPTICAL TIME DELAY/FILTER DEVICE FOR ELECTRICAL SIGNALS

[75] Inventor: Richard A. Soref, Newton Centre, Mass.

[73] Assignee: The United States of America as represented by the Secretary of the Air Force, Washington, D.C.

[21] Appl. No.: 698,977

[22] Filed: Feb. 6, 1985

[51] Int. Cl.$^4$ .............................. G02B 6/26; G02F 1/00
[52] U.S. Cl. ................................ 350/96.15; 350/96.13; 350/96.14; 350/96.16
[58] Field of Search ............... 350/96.15, 96.16, 96.19, 350/96.20, 96.29, 96.30, 96.13, 96.14; 250/227; 455/601, 610, 612

[56] References Cited

U.S. PATENT DOCUMENTS

| 3,596,104 | 7/1971  | Macomber        | 250/227 X   |
| 3,781,722 | 12/1973 | Pierson         | 333/31 R    |
| 3,838,278 | 9/1974  | Duguay et al.   | 250/227     |
| 3,878,520 | 4/1975  | Wright et al.   | 343/854     |
| 4,028,702 | 6/1977  | Levine          | 343/100 SA  |
| 4,128,759 | 12/1978 | Hunt et al.     | 250/199     |
| 4,219,785 | 8/1980  | Scifres et al.  | 331/94.5 H  |
| 4,258,363 | 3/1981  | Bodmer et al.   | 343/16 R    |
| 4,262,992 | 4/1981  | Berthold        | 350/96.14   |
| 4,296,319 | 10/1981 | Franks et al.   | 250/227     |
| 4,297,656 | 10/1981 | Pan             | 331/135     |
| 4,418,980 | 12/1983 | Keil et al.     | 350/96.13   |
| 4,522,495 | 6/1985  | Shajenko        | 250/227 X   |

FOREIGN PATENT DOCUMENTS 0074526  4/1984  Japan ................................. 350/96.3

OTHER PUBLICATIONS

Gfeller, F., "Bypass Switch for Optical Fiber Ring Network", IBM Technical Disclosure Bulletin, vol. 24, No. 3, 8-1981, pp. 1493–1495.
Sheehan, P. G. et al, "The Use of Optical Techniques for Beamforming in Phased Arrays", SPIE, vol. 477, 1984, pp. 82–89.
Popa, Adrian E., "Fiber Optics Implications for Radar Equipment Design", Electro-81 Conference Record, New York, New York, April 7-9, 1981, pp. 1–6.
Kondo et al, "High-Speed Optical Time Switch with Integrated Optical 1×4 Switches and Single-Polarization Fiber Delay Lines," Technical Digest, 4th International Conference on Integrated Optics and Fiber Optic Communication (Tokyo, Japan), 1983, paper 29D3-7.
Taylor, Henry F., "Fiber and Integrated Optical Devices for Signal Processing," SPIE, vol. 176, Guided Wave Optical Systems & Devices II, 1979, pp. 17–27.
McCaughan, Leon, "Low-Loss Polarization-Independent Electrooptical Switches at $\lambda=1.3$ $\mu$m," IEEE Journal of Lightweight Technology, vol. LT-2, No. 1, Feb. 1984, pp. 51–55.
Bulmer, C. H. et al, "High-Efficiency Flip-Chip Coupling between Single-Mode Fibers and $LiNbO_3$ Channel Waveguides," Applied Physics Letters, 37, (4), Aug. 15, 1980, pp. 351–353.
Chang, C. T. et al, "Fibre-Optic Delay-Line Devices for R.F. Signal Processing," Electronics Letters, 13, No. 22, Oct. 27, 1977, pp. 678–680.
Kondo, et al, "Integrated Optical Switch Matrix for Single-Mode Fiber Networks," IEEE Journal of Quantum Electronics, vol. QE-18, No. 10, Oct. 1982.

Primary Examiner—John Lee
Attorney, Agent, or Firm—Jacob N. Erlich; Donald J. Singer

[57] ABSTRACT

A length dependent, optical time delay/filter device for electrical signals having a single integrated optical switching circuit and only two optical time delay components connected thereto. The optical time delay components are each made up of a plurality of optical fibers of varying lengths. Depending upon which fibers an optical signal (converted from an incoming electrical signal) passes through determines the time of travel of the optical signal through the device. This optical signal is then converted back into an electrical output signal which is, as a result thereof, time delayed/filtered.

16 Claims, 4 Drawing Figures

LENGTH DEPENDENT, OPTICAL TIME DELAY/FILTER DEVICE FOR ELECTRICAL SIGNALS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to time delay systems, and, more particularly, to an optical time delay system for electrical signals which converts these electrical signals into optical signals in order to provide a length dependent time delay/filter device.

There are numerous electronic devices and components in which it is desirable to utilize an electronic signal which has been delayed in time by a prescribed and controllable amount. A controlling signal is used to select the delay. Heretofore the time delaying of electrical signals has been accomplished by several methods including (1) the switching-in of different lengths of coaxial cable in the manner described in U.S. Pat. No. 3,781,722; and (2) the operation of electronic circuit components such as integrated circuits, discrete transistors, and charge-coupled devices.

Some of the more commonly referred to delay circuits include: (1) the multivibrator delay circuit in which a cathode-coupled or emitter-coupled monostable multivibrator may be used as an approximately linear delay circuit; (2) a linear time delay circuit which makes use of a linear saw tooth generator, such as the boot strap or Miller integrator, whose output is compared with a calibrated DC reference voltage level; (3) a circuit that combines the functions of a gate waveform generator, a clamp, and a linear saw tooth generator; and (4) a circuit that combines the Miller integrator saw tooth generator with the gating function and wherein the output is applied to a comparator in a complete linear time delay circuit.

Unfortunately the deficiencies of the prior art electronic delay circuits are numerous. For example, the coaxial devices are bulky and suffer from attenuation and distortion at high frequencies. The electronic devices have cost and complexity factors which markedly increase as the signal bandwidth and/or frequency go up to 1 GHz and beyond. In fact, in some cases the signal amplitude may be adversely affected, and equalization systems or circuits may also be required. The delays in such electronic circuits are many times selected with a potentiometer, rather than being under computer control. In the charge-coupled device approach, very complicated clocking networks are required which cause a considerable drawback. In the SAW devices it is extremely difficult to alter the delay factor. Generally in all such electronic time delay circuits, it is difficult to obtain ultra short delays in the 0.05 ns range. Furthermore, without using free-space propagation, it is difficult to provide remote transmission of the delay signal.

Consequently, and as is clearly evident by the above analysis of such electronic time delay devices, the prior art electronic devices do not satisfy the simultaneous requirements of compactness, simplicity, remote "invulnerable" transmission, multi-gigahertz bandwidth, constant amplitude, cost effectiveness, ultra short delays, numerous delay steps, low-power computer control and rapid updating of delay that is generally required in some of the newer "optical/microwave" systems.

One such new application of electrical time delay circuits can be found in the optical/microwave phased-array antenna. In such a hybrid antenna there are stringent requirements of computer-control, viable coupling and, of course, variable delay devices for steering the radiation beam. Furthermore, rapid changes in beam pointing direction are desirable, and such a factor imposes a rapid transition time on the programmable devices incorporated therein. In fact, transition times as short as 1 ns are desirable, although 0.01 to 10 microseconds would be acceptable in some cases. Still further, there are instances in which bandwidth of at least 2 GHz is needed, together with discrete accurate control of the time delay. Even further, approximately 100 equal steps of delay per device is frequently required, with the minimum step being about 0.05 ns. In conjunction with all of the above requirements it is generally conceded that the control power per device should be less than 0.05 watts. As is clearly evident from the above explanation of the prior art electronic devices, such purely electronic time delay circuits fall short in requirements for the new "optical/microwave" systems in use today and in the future.

Prior voltage controlled, length dependent, time delay devices are exemplified in the following publications: (1) Kondo et al, "High-Speed Optical Time Switch with Integrated Optical 1×4 Switches and Single-Polarization Fiber Delay Lines, " *Technical Digest, Fourth International Conference on Integrated Optics and Fiber Optic Communication* (Tokyo, Japan), 1983, paper 29D3-7; and (2) Taylor, Henry F., "Fiber and Integrated Optical Devices for Signal Processing," SPIE, Vol. 176, Guided Wave Optical Systems and Devices II, 1979, pgs 17-27.

Unfortunately, the above-mentioned length dependent time delay devices by Kondo et al and Taylor have a number of drawbacks associated therewith. For example, the Kondo et al device relies upon a single-stage time delay of limited capacity, and the Taylor device is confronted with problems of high optical loss as a result of the three stage two-fiber system. In addition, any filtering capability provided therein is not variable. Consequently, it is readily understood that a need still arises for improved voltage controlled, length dependent time delay/filtering devices.

SUMMARY OF THE INVENTION

The present invention overcomes the problems of past optical, length dependent, time delay systems as set forth in detail hereinabove, by providing a length dependent, optical time delay/filter device for electrical signals which is capable of controlling either single or multiple switching simultaneously. By converting the electrical signals into an optical signal, the time delay can be dependent upon the length of the path of the optical signal. Furthermore, by relying upon an optical signal, the time delay/filter device of the present invention is capable of providing extremely short time delays capable of meeting the needs of the new "optical/microwave" systems in use today and in the future.

The present invention inputs an electrical signal, which is to be time delayed, into an optical source such as a laser diode typically of 2-10 milliwatts power. This optical source converts the incoming electrical signal into an intensity modulated optical signal which is passed through a single mode optical fiber. The optical fiber is connected to an integrated optical circuit in the form of a single crystal LiNbO$_3$ substrate which acts as a switching circuit. An aligning/coupling element in the form of a silicon V-groove array interconnects the single mode fiber with the switching circuit. In addition to acting as an aligning and coupling means for the incoming single mode fiber, the silicon V-groove array also acts as an aligning and coupling means for one of a pair of time delay components while a second silicon V-groove array acts as an aligning and coupling means for the other of the pair of time delay components.

Each of these pair of time delay components or "stages" are in the form of a plurality of single mode fibers of varying lengths. The switching circuit to which the pair of time delay components are interconnected incorporates therein a series of voltage controlled electrooptical switching elements in order to preselect the particular fibers of each of the time delay components through which the optical signal will propagate.

Outputting from the switching circuit is another single mode optical fiber which is also interconnected and aligned to the switching circuit by means of a silicon V-groove array. The optical signal output therefrom after passing through preselected optical fibers of both time delay components inputs into an optical detector or photodiode. The photodiode converts this optical signal back into an electrical signal which is time delayed/filtered.

It is essential that only two such time delay components be incorporated within the present invention in order to maintain minimal optical losses and produce accurately time delayed output signals. By providing a variable voltage source in conjunction with the switching elements, the electrooptical switching elements can control in advance the preselected path length through which the optical signal will travel. If desirable, with the present invention the optical signal can also be controlled to simultaneously pass through a plurality of fibers making up a time delay component. Such an arrangement allows for filtering of the input signal to take place. In addition, by specifically defining the particular length of each of the fibers making up the pair of time delay components the output electrical signal can be time delayed by equal increments.

With the transmissive time delay/filter device of the present invention an optical signal can pass in one direction through preselected fibers of the pair of time delay components, the time delay being dependent upon the path lengths of the fibers being traversed. A reflective time delay/filter device is created by constraining the optical signal to travel forth and back over the same piece of fiber. This duplex transversal is arranged by applying a highly reflective optical coating to the free cleaved end of each of the fibers In one such alternate embodiment of the present invention a reflective time delay component is combined with a transmissive time delay component.

In another embodiment of this invention a dual reflective time delay/filter device is effected by combining a pair of reflective time delay components. It is also possible in a further embodiment of the present invention to incorporate one or both of the time delay components directly within the switching circuit thereby even further substantially reducing any optical losses associated with the other embodiments of the present invention.

To obtain an even larger number of delay steps, the length dependent, optical time delay/filter device of the present invention can be combined in an optical series arrangement with the time delay system for electrical signals as set forth in U.S. patent application Ser. No. 698,979 entitled "Wavelength Dependent, Tunable, Optical Time-Delay System for Electrical Signals" filed on the same date as this invention by the present inventor or the present invention may be combined with the time delay system for electrical signals as set forth in U.S. patent application Ser. No. 698,721 entitled "Mode Dependent, Optical Time Delay System for Electrical Signals" also filed on the same date as this invention by the present inventor together with A. Yang and R. Payne.

It is therefore an object of this invention to provide a optical time delay/filter for electrical signals which relies upon the path length transversed by the optical signal in order to establish the time delay.

It is another object of this invention to provide a length dependent, optical time delay/filter for electrical signals which can generate "true time delays" in the 10 to 150 ps range.

It is a further object of this invention to provide a length dependent, optical time delay/filter device for electrical signals in which the time delay can be easily and reliably selected by a controllable voltage source.

It is a further object of this invention to provide a length dependent, optical time delay/filter device for electrical signals in which the switching times are extremely fast.

It is still a further object of this invention to provide a length dependent, optical time delay/filter device for electrical signals which can be readily incorporated within other optical systems.

It is an even further object of this invention to provide a length dependent, optical time delay/filter device for electrical signals which is extremely simple in its structural configuration.

It is still another object of this invention to provide a length dependent, optical time delay/filter device for electrical signals which is economical to produce and which utilizes conventional, currently available components that lend themselves to standard mass production manufacturing techniques.

For a better understanding of the present invention, together with other and further objects thereof, reference is now made to the following description taken in conjunction with the accompanying drawings and its scope will be pointed out in the appended claims.

DETAILED DESCRIPTION OF THE PREFERRED EMBODIMENTS

Figure 1:
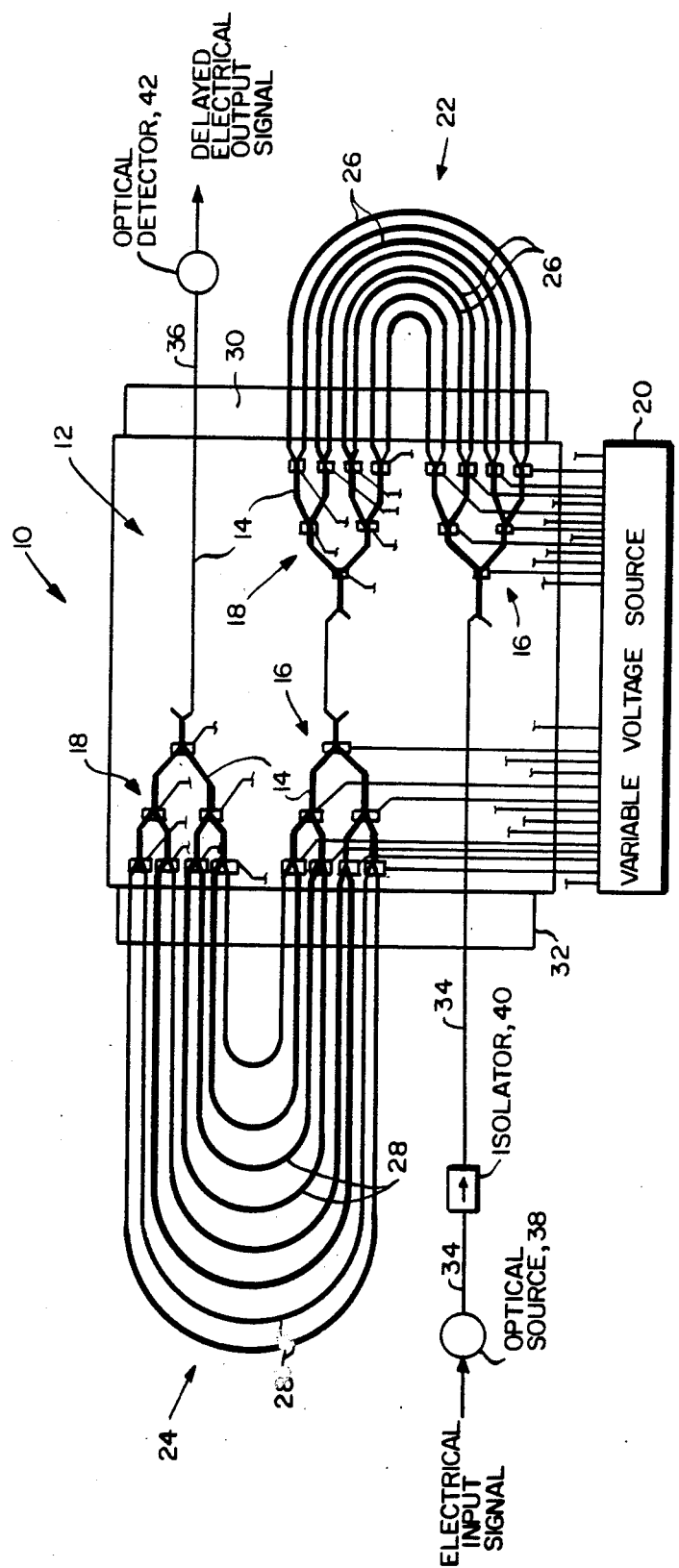
FIG. 1 is a schematic illustration of the totally transmissive, length dependent, optical time delay/filter device for electrical signals of the present invention.

Reference is now made to FIG. 1 of the drawings which schematically illustrates the fully transmissve, length dependent, optical time delay/filter device for electrical signals 10 of the present invention. Optical time delay/filter device 10 is made up of a single integrated optical switching circuit 12 in the form of a single-crystal electrooptic substrate made of LiNbO$_3$ with Ti-diffused single mode channel waveguides 14, or a compound semiconductor material (ternary or quaternary) with appropriately doped channel guides 14. Presently titanium in-diffusion in LiNbO$_3$ represents the most significant process. An example of such a LiNbO$_3$ switching circuit 12 can be found in the publication by Leon McCaughan, "Low-Loss Polarization-Independent Electrooptical Switches at $\lambda=1.3$ $\mu$m," IEEE Journal of Lightwave Technology, LT-2, No. 1, Feb. 1984, pgs 51–55. The waveguides within switching circuit 12 are formed in such a manner so as to contain two 1×8 electrooptical switching networks 16 and two 8×1 electrooptical switching networks 18. Switching networks 16 and 18 are electrically interconnected to any suitable variable voltage source 20 which provides the appropriate voltages so as to control the passage of an optical signal in a preselected manner as described hereinbelow.

Optically interconnected to the switching networks 16 and 18 are a pair of time delay components 22 and 24. These time delay components 22 and 24 are each made of a plurality of single mode optical fibers, with fibers 26 being representative of the optical fibers of time delay component 22 and optical fibers 28 being representative of the optical fibers of time delay component 24. It is essential in the present invention that the integrated optical switching circuit 12 be singular (that is, only one in number) and that the time delay components 22 and 24 be limited to only two such time delay components. Such a configuration offers a far greater number of delays with only a modest increase in the number of switching elements as been heretofore proposed. In addition, optical insertion loss is held to a minimum by using only two such time delay components 22 and 24.

Aligning and optically connecting the time delay components 22 and 24 to appropriate switching networks 16 and 18 of switching circuit 12 are a pair of aligning and coupling elements 30 and 32 in the form of, preferably, silicon V-groove arrays. Examples of such silicon V-groove arrays can be found in the publication of C. H. Bulmer et al, "High-efficiency flip chip coupling between single-mode fibers and LiNbO$_3$ channel waveguides," *Applied Physics Letters*, 37 (4), 15 Aug. 1980, pgs 351–353. In addition to optically aligning the time delay components 22 and 24 to the integrated optical switching circuit 12, the aligning and coupling element 32 interconnects the input single mode optical fiber 34 to switching network 16 of time delay component 22 while the aligning and coupling element 30 connects the output single mode optical fiber 36 to the switching network 18 of time delay component 24. (All of this coupling is done with low loss and mode preservation). The optical interconnection or coupling of the opposite ends, respectively, of time delay components 22 and 24 are performed within the integrated optical switching circuit 12 by means of waveguide 14 which is formed between the output end of 8×1 switching network 18 to the input end of 1×8 switching network 16.

With the embodiment of the invention as shown in FIG. 1 of the drawings an electrical input signal is fed into an optical source 38. Preferably optical source 38 is in the form of a laser diode typically of 2–10 mW in which the electrical input signal is converted into an optical signal. This optical signal travels along the single mode optical fiber 34. Also coupled to optical fiber 34 is an optical isolator 40 which is utilized to avoid any unwanted perturbation of the laser diode source 38 by preventing optical reflections from time delay components 22 and 24 of the time delay/filter 10 of the present invention from reaching optical source 38. Such an isolator 40 may be in the form of a Faraday-rotation type device in series with source 38.

Connected or coupled to the output end of the time delay/filter device 10 of the present invention is a single mode optical fiber 36. Any conventional optical detector in the form of photodiode 42 is coupled to optical fiber 36 in order to convert the delayed optical signal back into an electrical signal which is output therefrom. Consequently with the present invention, the electrical input signal is time delayed in proportion to the length of the optical fibers (26 and 28) making up the pair of time delay components 22 and 24. For example, the optical propagation time per unit length of fiber is 5 ns per meter.

By controlling the voltage source 20, the appropriate path through which the optical signal passes is effectively controlled. Thus, for a shorter time delay the optical signal passes through the shortest length of optical fiber 26 of time delay component 22 and the shortest length of optical fiber 28 of time delay component 24.

Since it is critical, in most instances, for the electrical output signal to be time delayed in equal increments, each of the optical fibers 26 of time delay component 22 are increased in length with respect to an adjacent fiber by the same amount, hereinafter referred to as $\Delta L_1$. This length $\Delta L_1$ is then utilized to determine the amount of length increase of each fiber 28 with respect to an adjacent fiber. This length difference of fibers 28 is hereinafter referred to as $\Delta L_2$. The relationship between the lengths $\Delta L_1$ and $\Delta L_2$ is set forth by the following relationship:

$$\Delta L_2 = N\Delta L_1$$

where N = the number of optical fibers (26 or 28) in each of the time delay components 22 and 24.

It should be noted that in the present invention the number of fibers (26 or 28) in each of the time delay components 22 or 24 is equal. Consequently with the present invention, an operative example is illustrated in FIG. 1 of the drawings in which there are eight optical fibers utilized in each of the time delay components 22 and 24. Therefore, utilizing the above relationship between $\Delta L_1$ and $\Delta L_2$, $\Delta L_2 = 8\Delta L_1$. By providing the above dimensional criteria, the electrical output signal from optical fiber 36 is time delayed in equal increments.

Figure 2:
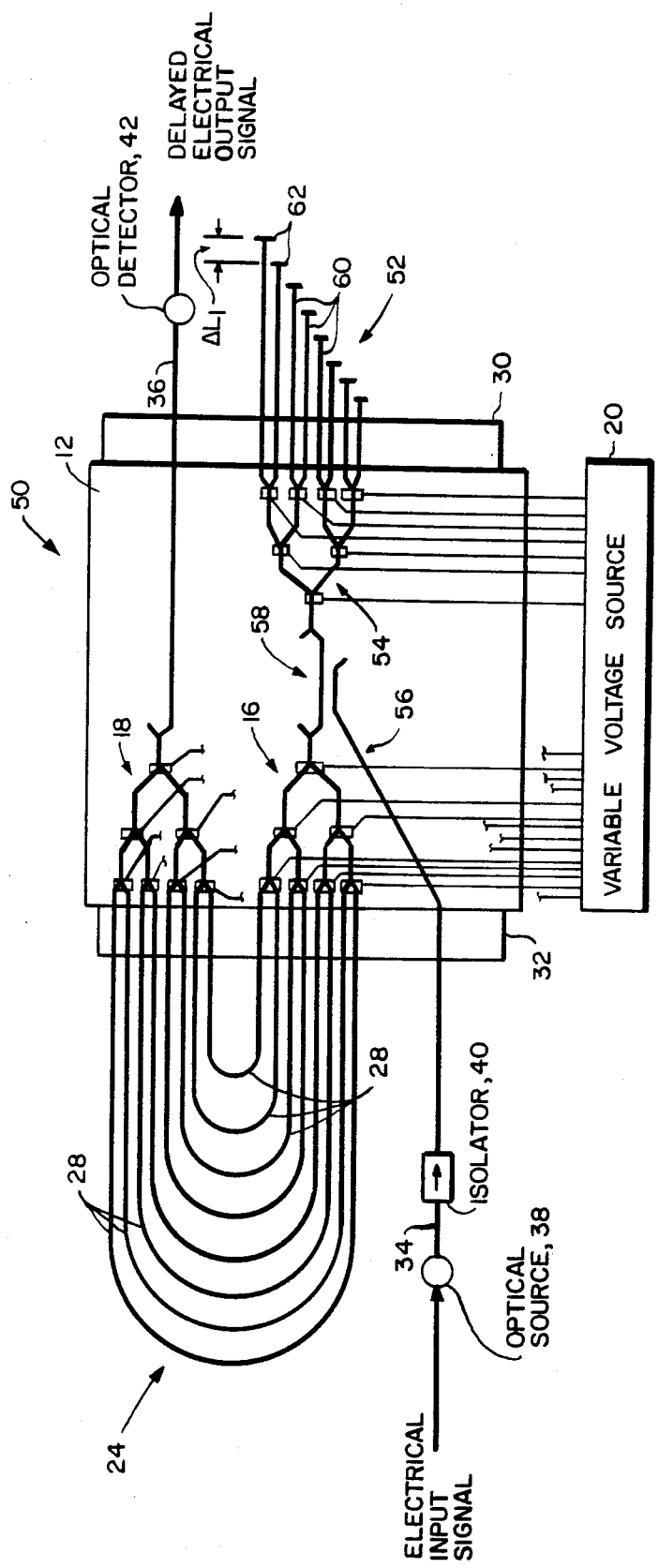
FIG. 2 is a schematic illustration of an alternate embodiment of the present invention illustrating a transmissive/reflective, length dependent, optical time delay/filter device for electrical signals.
Figure 3:
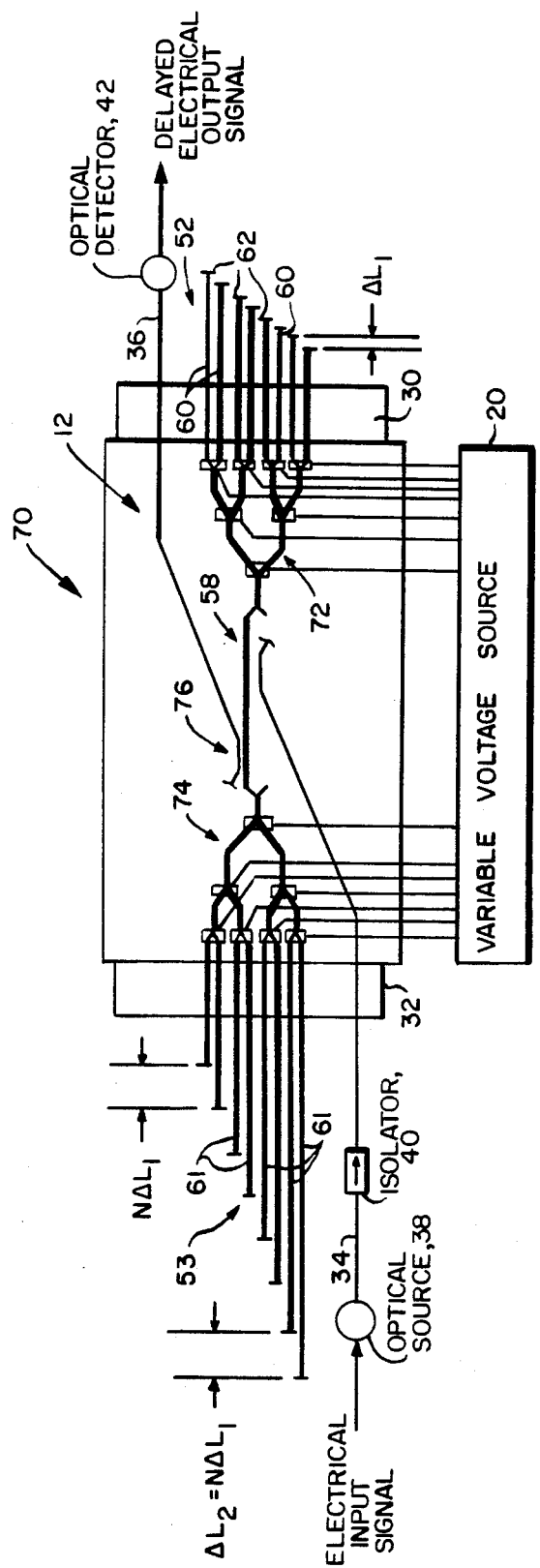
FIG. 3 is a schematic illustration of a further alternate embodiment of the present invention providing a totally reflective, length dependent, optical time delay/filter device for electrical signals.
Figure 4:
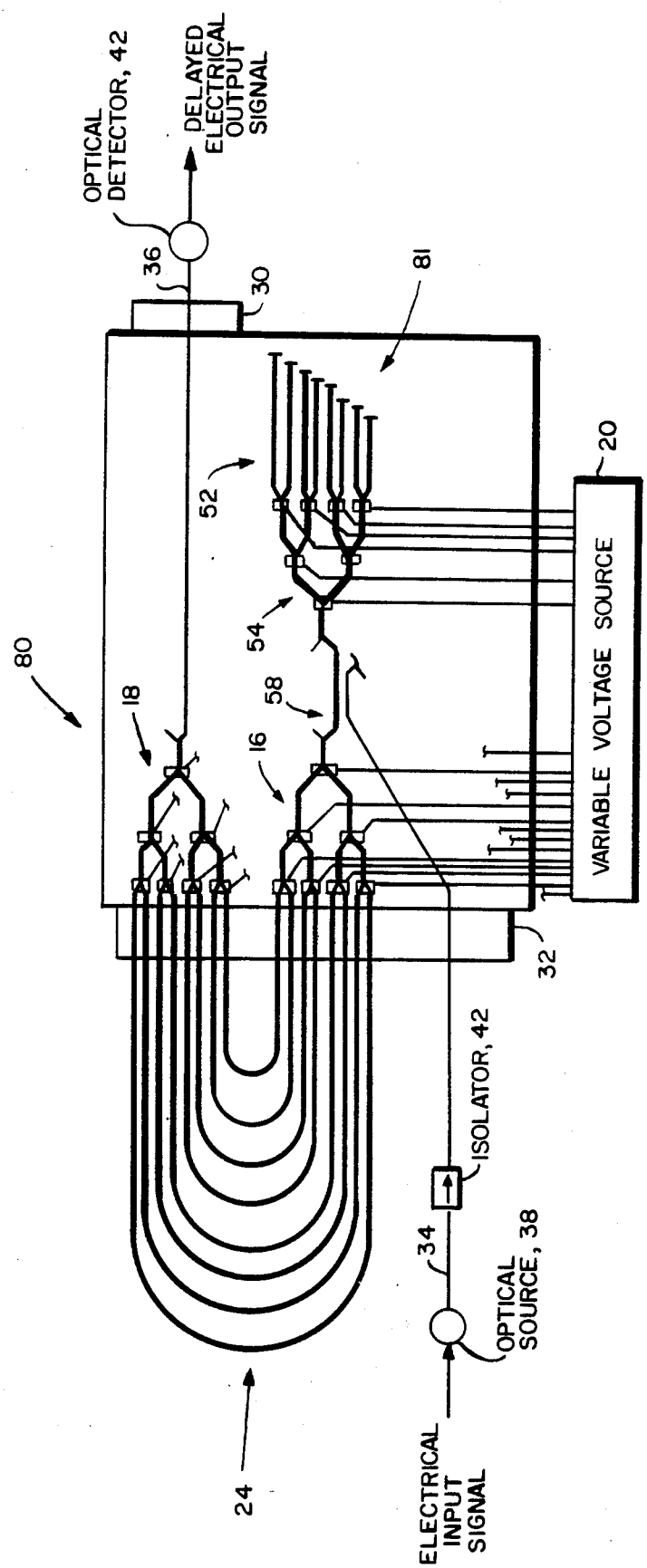
FIG. 4 is an even further alternate embodiment of the present invention depicting a self-contained, length dependent, optical time delay/filter device for electrical signals.

A less complex system of time delay/filtering can be accomplished by the embodiments schematically illustrated in FIGS. 2-4 of the drawings. In order to readily understand the concepts involved in these embodiments elements which are similar to those utilized with respect to FIG. 1 of the drawings will be labeled with identical reference numerals. Only those components which are different from those illustrated with respect to FIG. 1 will be given new reference numerals.

In the time delay/filter device 50 set forth in FIG. 2 of the drawings a transmissive time delay component 24 of the type set forth with respect to the time delay/filter device 10 illustrated in FIG. 1 of the drawings is combined with a reflective time delay component 52. By the utilization of reflective time delay component 52, the pair of switching networks 16 and 18 associated with time delay component of FIG. 1 can be combined into a single 1×8 switching network 54. Switching network 54 which is situated within the integrated optical switching circuit 12 is similarly interconnected with the variable voltage source 20 in the manner set forth with respect to the connections in FIG. 1.

The electrical input signal received by the transmissive/reflective optical time delay/filter device 50 is received through a waveguide 56. Similar to the arrangement disclosed in FIG. 1 with respect to time delay/filter device 10, a coupling and aligning means 32 couples the input single mode optical fiber 34 to waveguide 56. In order to accomplish the appropriate coupling between the input beam and reflective time delay component 52 and the transmissive time delay component 24 is a 3dB coupler 58. Coupler 58 is interposed between switching network 54 of time delay component 52 and switching network 16 of time delay component 24. The utilization of 3dB coupling element 58 allows for half of the input light to be received by time delay component 52 so that reflective light from time delay component 52 can also be directed into time delay component 24.

As illustrated in FIG. 2 of the drawings, the reflective time delay component 52 is made up of a plurality, preferably eight in number, of single mode optical fibers 60 which are directly interconnected to the 1×8 switching network 54. This reflective time delay component 52 is constructed by constraining the optical signal to travel forth and back over the same piece of fiber. This duplex transversal is arranged by applying a highly reflective coating 62 to each of the free cleaved ends of optical fibers 60. As with the time delay component 22 set forth in FIG. 1 of the drawings, each of the fibers 60 utilized with time delay component 52 is increased in length by an amount $\Delta L_1$ over the next shorter fiber. In order for equal increment time delay it is essential for each of the fibers 28 in the transmissive time delay component 24 be increased $2\Delta L_1$ over the next shorter fiber as with the time delay components 22 and 24. In this instance N also represents the number of optical fibers in each of the time delay components, and consequently in the embodiment set forth in FIG. 2 of the drawings the length of each of the optical fibers 28 making up time delay component 24 are increased by an increment $\Delta L_2$ where $\Delta L_2 = 16\Delta L_1$, (the two fold increase in $\Delta_2$ relative to FIG. 1 occurs because of the double-pass nature of stage 52 compared to the single-pass stage 24).

With the arrangement depicted in FIG. 2 of the drawings the complexity of the time delay/filter device 50 is approximately 25% less than the complexity of time delay/filter device 10 shown in FIG. 1 of the drawings However, the embodiment illustrated in FIG. 2 does add an additional 6dB of optical loss as a result of the use of coupler 58. This loss, however, is acceptable in view of the less complex structure.

With respect to FIG. 3 of the drawings, this embodiment of the present invention (wherein elements similar to those previously described are given identical reference numerals) provides an even more simplified embodiment of the present invention. This embodiment is hereinafter referred to as totally (dual) reflective optical time delay/filter device 70. In this embodiment, the integrated optical switching circuit 12 incorporates therein a pair of reflective time delay components 52 and 53 and only two switching networks 72 and 74, wherein switching network 72 is a 1×8 switching network and switching network 74 is an 8×1 switching network. Additionally, the increased lengths of the fibers 60 and 61 of time delay components 52 and 53, respectively, are $\Delta L_1$ for fibers 60 and $N\Delta L_1$ for fibers 61.

In order for the time delay/filter device 70 to be operative, it is necessary to not only include within the integrated optical switching circuit 12 a first 3dB coupler 58 to input the optical signal into the reflective time delay component 52, but also a second 3dB coupler 76 to accept the output from reflective time delay component 74 and to pass this optical signal through optical fiber 36 to the optical detector or photodiode 42 for conversion back into a time delayed electrical signal output.

As is clearly evident with respect to the time delay/filtering device set forth in FIG. 3 of the drawings, the arrangement is relatively simple because only two electro-optical networks 72 and 74 are required. There is an added loss (of approximately 12 dB) with respect to the embodiment of FIG. 1, however in view of the simplicity of this device 70 it is clearly within acceptable limits.

The embodiment of FIG. 4 provides a device in which at least one of the time delay components 52 is formed directly within the optical integrated switching circuit 12. This time delay/filtering device 80 enables the entire device to be quite compact. For example, as illustrated in FIG. 4, the reflective time delay component 52 is replaced by a channel-waveguide delay path formed directly within the switching circuit 12. The highly reflective optical surface 81 that terminates the delaying optical waveguides can be an etched-facet mirror or a mass-transported mirror as known in the integrated-optics art. In all other aspects of this embodiment of the invention, time delay device 80 is identical in operation to the time delay device 50 set forth with respect to the embodiment set forth in FIG. 2 of the drawings. Consequently no further detailed description of this embodiment is necessary. It should, however, be pointed out that the embodiment in FIG. 4 may be formed of a pair of transmissive time delay components or a pair of reflective time delay components if so desired.

It should also be realized that although the above descriptions have basically dealt with a time delay circuit arrangement, by the appropriate regulation or control of the various switching networks an optical signal can be made to pass not only through one of each of the optical paths of each time delay component, but the optical signal can be passed simultaneously through a number of optical fibers of a time delay component. In this manner the present invention acts, in essence, as an optical transversal filter.

In so doing, the output is a complex RF waveform. Due to the filtering, this waveform has been modified with respect to the RF input waveform. The optical "carrier" was modulated in accordance with the RF input. The present invention also allows for the programability of a transversal filter, that is, it is actually voltage tuned and controlled by variable voltage source 20. Consequently the present invention can change three properties in merely a few nanoseconds; (1) the filter's center frequency, (2) the filter's spectral-width, and (3) the amplitude weighting of the filter characteristic, that is, the filter shape. It had been recognized that such type of filtering would be desirable in the publication by Chang, Cassaboom and Taylor, "Fiber-Optic Delay Line Devices for R. F. Signal Processing," *Electronics Letters*, 13, No. 22, 27 Oct. 1977, pgs. 678–680.

Although this invention has been described with reference to particular embodiments, it will be understood that this invention is also capable of further and other embodiments within the spirit and scope of the appended claims.

I claim:

1. A length dependent, optical time delay/filter device for electrical signals comprising:
   a single integrated optical switching circuit;
   only two optical time delay components, said time delay components being optically connected to each other through said switching circuit, one of said optical time delay components containing a preselected number of single mode optical fibers with one of said preselected number of optical fibers being of a predetermined length and each of the other of said optical fibers of said one optical time delay component being of an increased length by the amount $\Delta L_1$ over the next shortest fiber, respectively, and the other optical time delay component including a preselected number of single mode optical fibers, with one of said preselected number of optical fibers of said other time delay component being of predetermined length and each of the other of said optical fibers of said other time delay component being of an increased length by the amount $N\Delta L_1$ over the next shortest fiber, respectively, where N equals said preselected number;
   said switching circuit including a plurality of electro-optical switching networks and means for applying a controlled amount of voltage to said switching networks in order to pass an optical signal through a preselected single or plurality of said optical fibers of said two optical time delay components;
   means, interconnected by a single mode optical fiber to said integrated optical switching circuit, for receiving an electrical input signal and converting said electrical input signal into said optical signal, said optical signal being received by a preselected optical fiber of said one optical time delay component and thereafter by a preselected fiber of said other optical time delay component, wherein said switching circuit determines which preselected fibers said optical signal passes through; and
   means for receiving said optical signal as it outputs from said other optical time delay component and for converting said output optical signal into an electrical signal which is output from said time delay/filter device, said electrical output signal being time delayed a predetermined amount, said predetermined amount of said time delay being in direct relation to the total length of said preselected optical fibers said optical signal passes through.

2. A length dependent, optical time delay/filter device for electrical signals as defined in claim 1 wherein both of said two optical time delay components are fully transmissive.

3. A length dependent, optical time delay/filter device for electrical signals as defined in claim 1 wherein both of said two optical time delay components are reflective.

4. A length dependent, optical time delay/filter device for electrical signals as defined in claim 1 wherein one of said two optical time delay components is reflective and the other of said two time delay components is fully transmissive, and wherein said increased length of said fully transmissive time delay component is determined by multiplying $N\Delta L_1$ by 2.

5. A length dependent, optical time delay/filter device for electrical signals as defined in claim 1 wherein at least one of said optical time delay components is formed within said optical switching circuit.

6. A length dependent, optical time delay/filter device for electrical signals as defined in claim 1 further comprising means optically interposed adjacent said electrical input signal receiving and converting means for preventing optical reflections from said time delay components from reaching said electrical input signal receiving and converting means.

7. A length dependent, optical time delay/filter device for electrical signals as defined in claim 6 wherein both of said two optical time delay components are fully transmissive.

8. A length dependent, optical time delay/filter device for electrical signals as defined in claim 7 wherein said switching circuit includes four of said switching networks.

9. A length dependent, optical time delay/filter device for electrical signals as defined in claim 6 wherein both of said two optical time delay components are reflective.

10. A length dependent, optical time delay/filter device for electrical signals as defined in claim 9 wherein said switching circuit includes two of said switching networks.

11. A length dependent, optical time delay/filter device for electrical signals as defined in claim 10 wherein said switching circuit further includes a pair of 3 dB couplers optically interconnected between said two switching networks.

12. A length dependent, optical time delay/filter device for electrical signals as defined in claim 6 wherein one of said two optical time delay components is reflective and the other of said two time delay components is fully transmissive, and wherein said increased length of said fully transmissive time delay component is determined by multiplying $N\Delta L_1$ by 2.

13. A length dependent, optical time delay/filter device for electrical signals as defined in claim 12 wherein said switching circuit includes three of said switching networks.

14. A length dependent, optical time delay/filter device for electrical signals as defined in claim 13 wherein said switching circuit further includes a 3dB coupler optically interconnected between two of said three switching networks.

15. A length dependent, optical time delay/filter device for electrical signals as defined in claim 6 further comprising means for coupling said time delay components to said switching circuit.

16. A length dependent, optical time delay/filter device for electrical signals as defined in claim 15 wherein said coupling means comprises at least one silicon V-groove array.

* * * * *